(12) United States Patent
Nakao et al.

(10) Patent No.: US 8,033,823 B2
(45) Date of Patent: Oct. 11, 2011

(54) HEAT PROCESSING APPARATUS

(75) Inventors: Ken Nakao, Tokyo-To (JP); Kazuhiko Kato, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 897 days.

(21) Appl. No.: 11/922,010

(22) PCT Filed: Jun. 12, 2006

(86) PCT No.: PCT/JP2006/311736
§ 371 (c)(1),
(2), (4) Date: Dec. 12, 2007

(87) PCT Pub. No.: WO2006/134862
PCT Pub. Date: Dec. 21, 2006

(65) Prior Publication Data
US 2009/0136888 A1    May 28, 2009

(30) Foreign Application Priority Data
Jun. 15, 2005 (JP) ................... 2005-175097

(51) Int. Cl.
*F27D 3/12* (2006.01)
(52) U.S. Cl. .................. 432/238; 432/212; 432/251
(58) Field of Classification Search .......... 432/83, 432/84, 113, 212, 238, 247, 251, 233
See application file for complete search history.

(56) References Cited

U.S. PATENT DOCUMENTS

| 5,097,890 A * | 3/1992 | Nakao ................. 165/206 |
| 5,507,639 A * | 4/1996 | Monoe ................ 432/77 |
| 6,328,561 B1 * | 12/2001 | Hasper et al. ........... 432/238 |
| 7,537,448 B2 * | 5/2009 | Saito et al. ............ 432/81 |
| 2002/0025688 A1 * | 2/2002 | Kato ................... 438/758 |

FOREIGN PATENT DOCUMENTS

| JP | 59-143039 | 9/1984 |
| JP | 64-48022 | 3/1989 |
| JP | 2-94626 | 4/1990 |

(Continued)

OTHER PUBLICATIONS

Japanese Office Action mailed on Feb. 2, 2010 for Japanese Application No. 2005-175097 w/ English translation.

(Continued)

*Primary Examiner* — Gregory A Wilson
(74) *Attorney, Agent, or Firm* — Smith, Gambrell & Russell, LLP

(57) ABSTRACT

The present invention is a heat processing apparatus comprising: a processing vessel that receives a plurality of objects to be processed in a tier-like manner to subject the objects to be processed to a predetermined heating process; a tubular heater disposed to surround the processing vessel, the tubular heater being capable of heating the objects to be processed; an exhaust heat system for discharging an atmosphere in a space between the heater and the processing vessel; and a cooling unit that blows out a cooling fluid into the space to cool the processing vessel. The heater has a tubular heat insulating member, and a heating resistor arranged on an inner circumference of the heat insulating member. The cooling unit has a plurality of blowing nozzles embedded in the heat insulating member. Each of the blowing nozzles is formed in such a manner that an inlet orifice of the blowing nozzle and an outlet orifice thereof are not linearly aligned to each other.

4 Claims, 5 Drawing Sheets

FOREIGN PATENT DOCUMENTS

| | | |
|---|---|---|
| JP | 7-99164 | 4/1995 |
| JP | 2645360 | 5/1997 |
| JP | 11-260744 | 9/1999 |
| JP | 2003-173980 | 6/2003 |

OTHER PUBLICATIONS

PCT Notification of Transmittal of Translation of the International Preliminary Examination Report (Form PCT/IB/338) dated Jan. 2004.

PCT International Preliminary Report on Patentability (Form PCT/IPEA/409) dated Apr. 2005.

Korean Office Action issued on May 28, 2009 for Korean Patent Application No. 10-2007-7026342 with English translation.

Supplementary European Search Report issued Sep. 21, 2009 for European Application No. 06 76 6598.

* cited by examiner

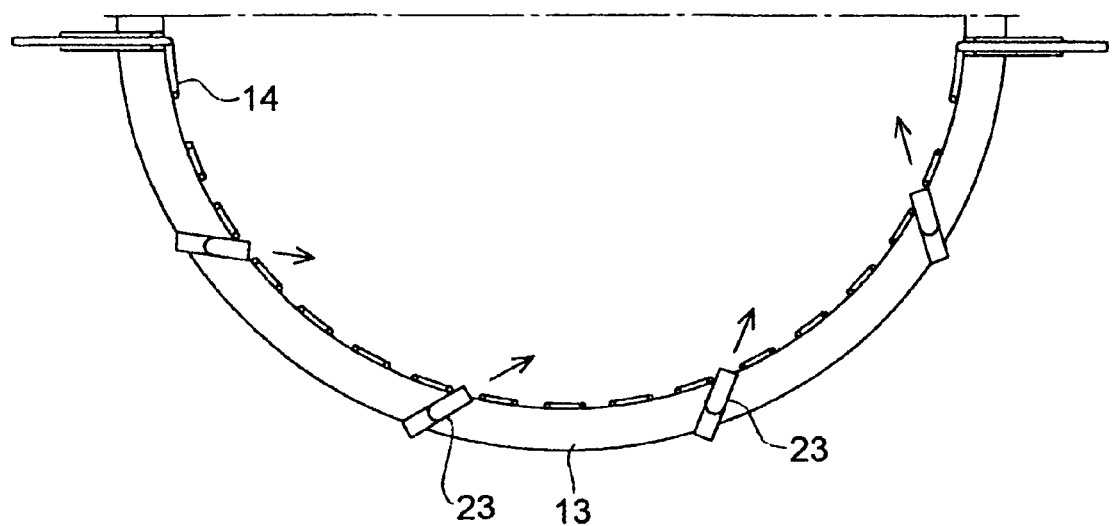
F I G. 3
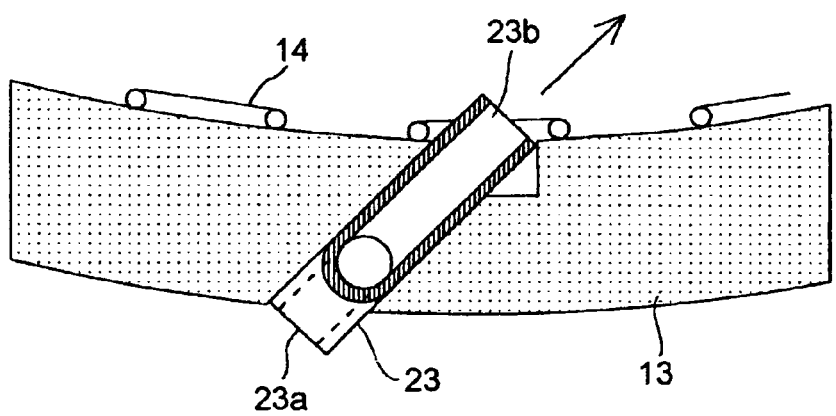
F I G. 4

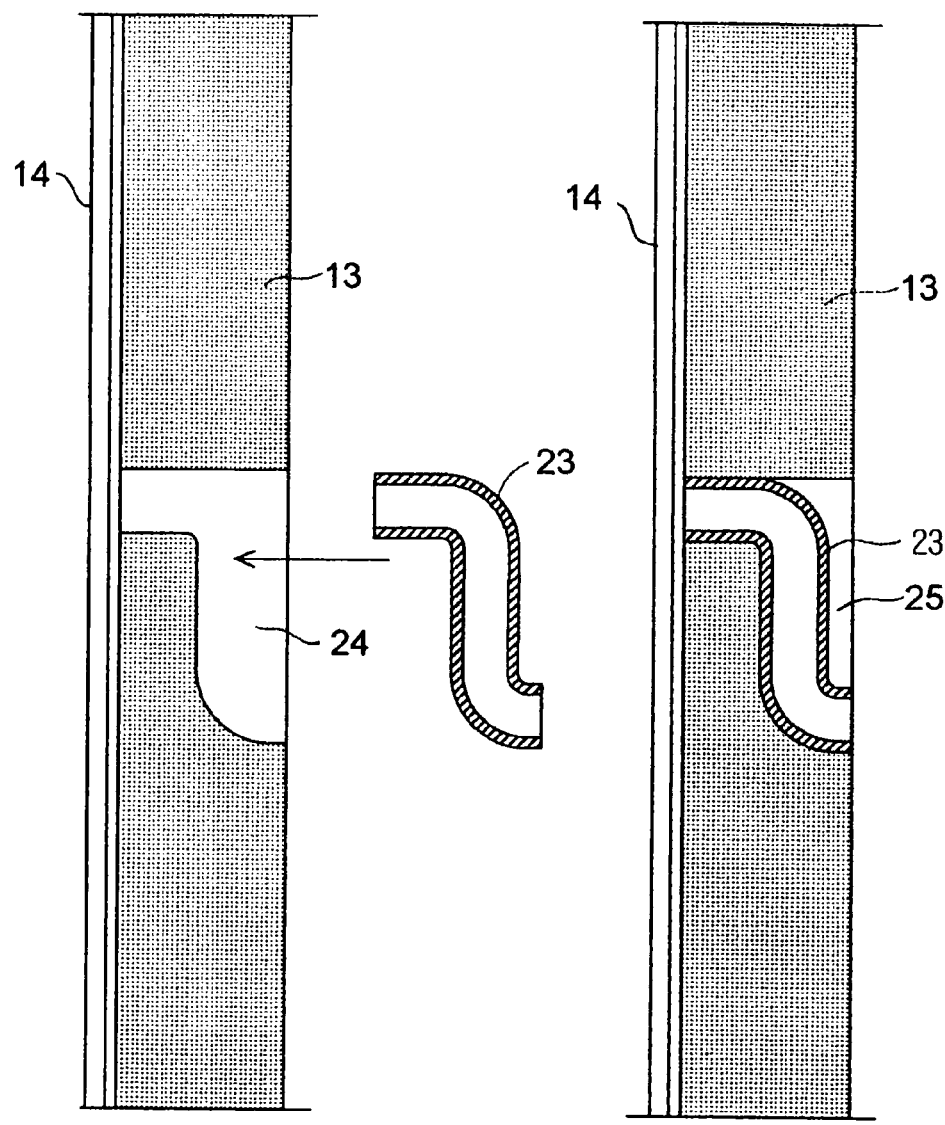
F I G. 5 A    F I G. 5 B
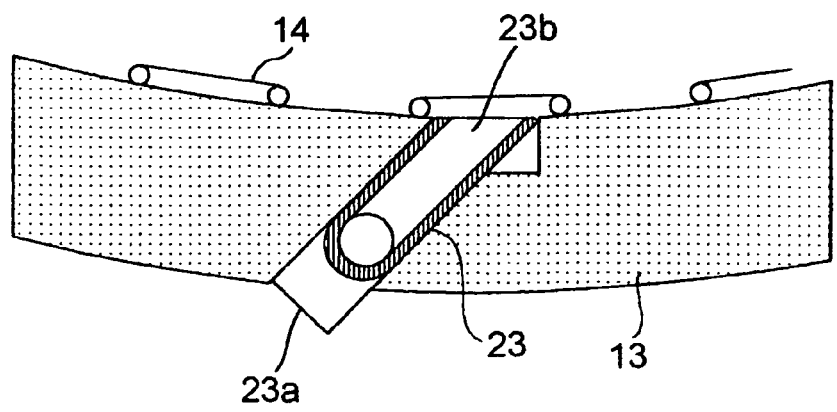
F I G. 6

HEAT PROCESSING APPARATUS

FIELD OF THE INVENTION

The present invention relates to a heat processing apparatus.

BACKGROUND ART

In the manufacturing process of a semiconductor device, various processing apparatuses (semiconductor manufacturing apparatuses) are used for subjecting an object to be processed, such as a semiconductor wafer, to an oxidation process, a diffusion process, a CVD (Chemical Vapor Deposition) process, and so on. One of the known processing apparatuses is a heat processing apparatus, such as a vertical heat processing apparatus of a batch type, which is capable of simultaneously heating and processing a number of objects to be processed.

Generally, in the vertical heat processing apparatus, a number of wafers, which are held by a boat as a holder in a tier-like manner with predetermined intervals therebetween, are received in a processing vessel. The wafers are heated by a tubular heater that is disposed to surround the processing vessel, so that the wafers are subjected to a predetermined heating process. The heater is generally formed by arranging a linear heating resistor on an inner circumference of a tubular heat insulating member.

It has been proposed to construct such a vertical heat processing apparatus in such a manner that, in order to improve speed and/or throughput of a process by promptly lowering temperature of wafers after the heating process, an atmosphere in a space between the heater and the processing vessel can be discharged, and that a cooling fluid can be introduced into the space to forcibly cool the processing vessel (see, for example, JP7-99164A and JP11-260744A).

Recently, in accordance with the increased number of wafers to be processed, there is a tendency to elongate lengths of the heater and other members incorporated in the heat processing apparatus (e.g., the processing vessel and the boat). Thus, temperatures of the incorporated members are prone to be non-uniformly lowered during the above forcible cooling step. This may result in non-uniformity in product quality of wafers.

On the other hand, when a diameter of a cooling-fluid nozzle is enlarged to increase a flowrate of the cooling fluid, heat dissipation caused by leakage of radiant light from the cooling-fluid nozzle is increased. This may invite problems in that uniformity of temperature inside the heater is degraded, and that temperature outside the heater is elevated.

In the art disclosed in JP11-260744A, a quick-cooling port opened obliquely upward is formed in a molded heat-insulating member, and a cooling medium introduced through the quick-cooling port forms a rotating flow. Thus, non-uniformity of temperatures of the incorporated members during the forcible cooling step can be restrained to a some degree. However, in order to supply the cooing medium to the quick-cooing port, it is necessary to dispose the predetermined number of vertically extending cooing-medium introducing paths in the molded heat-insulating member, which complicates the structure.

SUMMARY OF THE INVENTION

The present invention has been made in view of the above circumstances. The object of the present invention is to provide a heat processing apparatus that is capable of preventing leakage of radiant light from a cooling-fluid nozzle, and of restraining degradation of uniformity of temperature inside a heater and of restraining elevation of temperature outside the heater. In addition, the object of the present invention is to provide a heat processing apparatus that is capable of restraining non-uniformity during, temperature cooling and of achieving a simplified structure.

The present invention is a heat processing apparatus comprising: a processing vessel that receives a plurality of objects to be processed in a tier-like manner to subject the objects to be processed to a predetermined heating process; a tubular heater disposed to surround the processing vessel, the tubular heater being capable of heating the objects to be processed; an exhaust heat system for discharging an atmosphere in a space between the heater and the processing vessel; and a cooling unit that blows out a cooling fluid into the space to cool the processing vessel; wherein the heater has a tubular heat insulating member, and a heating resistor arranged on an inner circumference of the heat insulating member, the cooling unit has a plurality of blowing nozzles embedded in the heat insulating member; and each of the blowing nozzles is formed in such a manner that an inlet orifice of the blowing nozzle and an outlet orifice thereof are not linearly aligned to each other.

According to the present invention, each of the blowing nozzles embedded in the heat insulating member is formed in such a manner that the inlet orifice and the outlet orifice are not linearly aligned each other. Thus, it is possible to prevent leakage of radiant light from the blowing nozzle, and to restrain degradation of uniformity of temperature inside the heater and elevation of temperature outside the heater.

Preferably, each of the blowing nozzles is formed into a substantially Z-shape in a side view, with a lower end of the blowing nozzle forming the inlet orifice while an upper end thereof forming the outlet orifice. In this case, it is possible to prevent leakage and/or escape of radiant light and/or radiant heat from each of the blowing nozzles.

In addition, preferably, the respective blowing nozzles are inclined substantially at 45° relative to a direction toward a central axis of the heater in a plan view, in order to create a whirling flow of the cooling fluid in a circumferential direction of the space. In this case, since the whirling flow of the cooling fluid is created, non-uniformity of cooling temperature can be effectively restrained.

In addition, preferably, an outer circumference of the heat insulating member is covered with a shell, and the shell has a cooling-fluid introducing part that is in communication with the inlet orifice of each of the blowing nozzles. In this case, a cooling fluid can be supplied to each of the blowing nozzles, with such a remarkably simple structure.

Further, the present invention is a heater comprising: a tubular heat insulating member; and a heating resistor arranged on an inner circumference of the insulating member; wherein a plurality of cooling-fluid blowing nozzles, each having a substantially Z-shape in a side view, are embedded in the heat insulating member in such a manner that the cooling-fluid blowing nozzles are inclined substantially at 45° relative to a direction toward a central axis of the heater in a plan view, in order to create a flow of a cooling fluid which whirls along the inner circumference of the heat insulating member.

According to the present invention, it is possible to prevent leakage of radiant light from the blowing nozzles, and to restrain degradation of uniformity of temperature inside the heater and elevation of temperature outside the heater. As a result, non-uniformity of cooling temperature can be effectively restrained.

Furthermore, the present invention is a method of manufacturing a heater including a tubular heat insulating member and a heating resistor arranged on an inner circumference of the insulating member, the method comprising the steps of: arranging the heating resistor on the inner circumference of the heat insulating member; and embedding a plurality of cooling-fluid blowing nozzles, each having a substantially Z-shape in a side view, in the heat insulating member in such a manner that the cooling-fluid blowing nozzles are inclined substantially at 45° relative to a direction toward a central axis of the heater in a plan view, in order to create a flow of a cooling fluid which whirls along the inner circumference of the heat insulating member.

According to the present invention, it is possible to prevent leakage of radiant light from the blowing nozzles, and to restrain degradation of uniformity of temperature inside the heater and elevation of temperature outside the heater. As a result, non-uniformity of cooling temperature can be effectively restrained, while a structure can be simplified.

BRIEF DESCRIPTION OF THE DRAWINGS

FIG. 3 is a schematic transversal sectional view of a heater showing an arrangement example of blowing nozzles;

FIG. 4 is an enlarged sectional view showing a main part of FIG. 3;

FIGS. 5A and 5B are views for explaining a manufacturing method of a heater;

FIG. 6 is a sectional view of a partial modification of the blowing nozzle shown in FIG. 4;

BEST MODE FOR CARRYING OUT THE INVENTION

A best mode for carrying out the present invention will be described herebelow with reference to the drawings.

Figure 1:
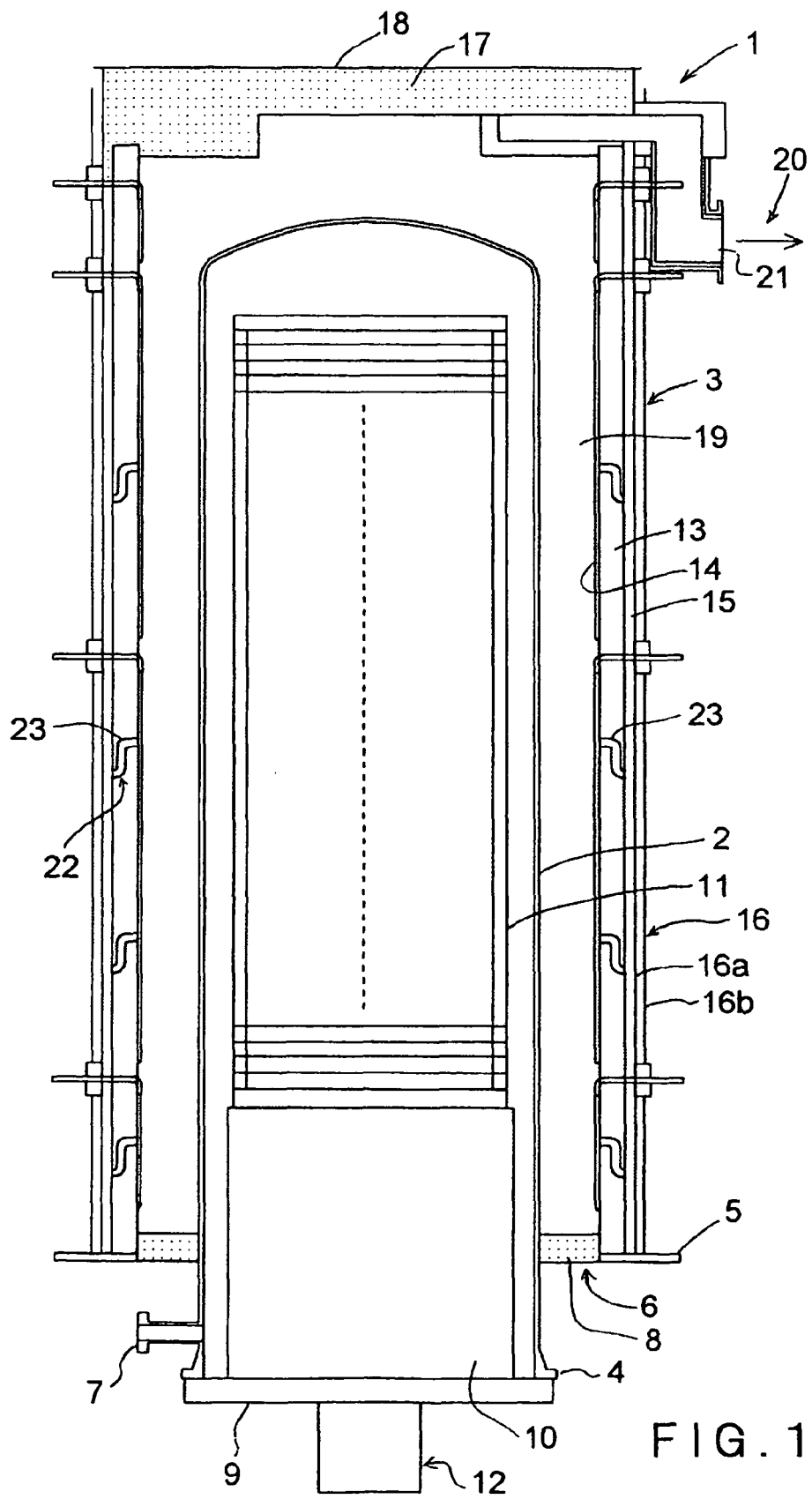
FIG. 1 is a longitudinal sectional view showing a schematic structure of a heat processing apparatus according to one embodiment of the present invention.
Figure 2A:
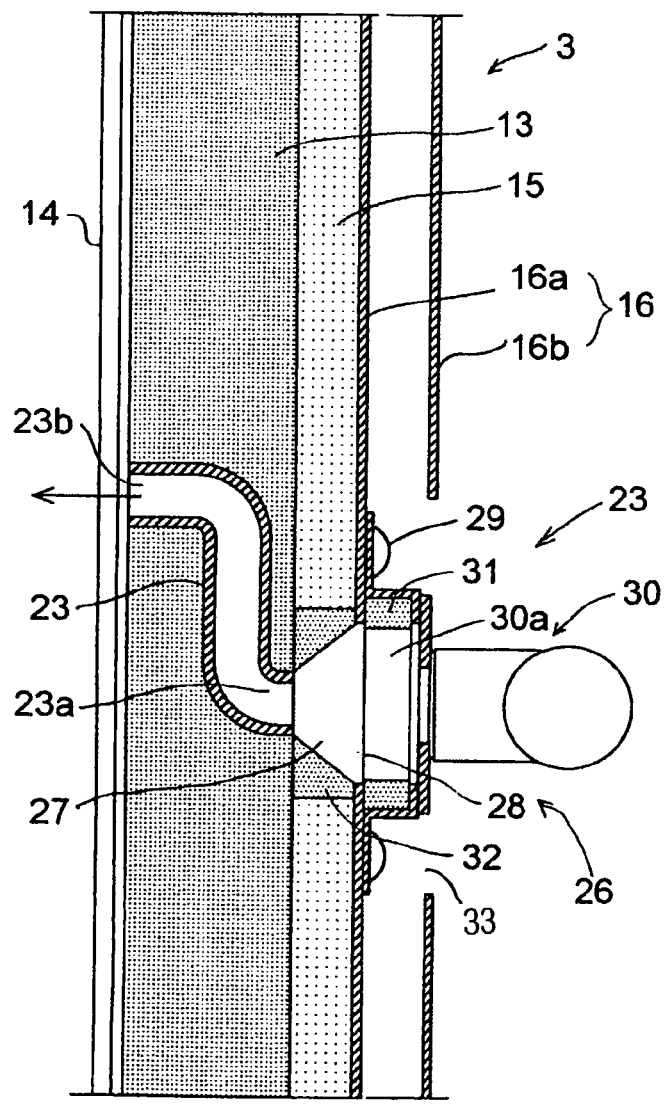
FIG. 2A is an enlarged sectional view showing a main part of the heat processing apparatus shown in FIG. 1.
Figure 2B:
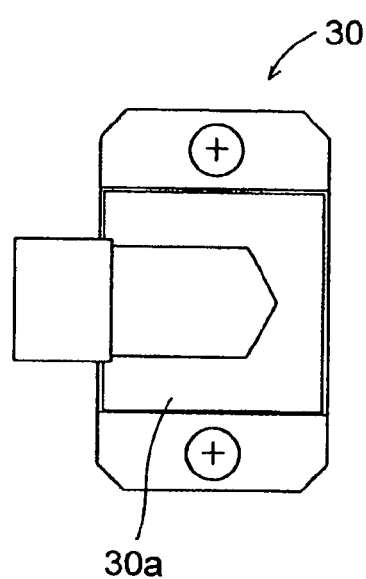
FIG. 2B is a front view of the cooling-medium introducing part shown in FIG. 2A.

FIG. 1 is a longitudinal sectional view showing a schematic structure of a heat processing apparatus according to one embodiment of the present invention. FIG. 2A is an enlarged sectional view showing a main part of the heat processing apparatus shown in FIG. 1. FIG. 2B is a front view of the cooling-medium introducing part shown in FIG. 2A. FIG. 3 is a schematic transversal sectional view of a heater showing an arrangement example of blowing nozzles. FIG. 4 is an enlarged sectional view showing a main part of FIG. 3.

As shown in the drawings, a heat processing apparatus 1 in this embodiment is a so-called vertical heat processing apparatus. The heat processing apparatus 1 includes a processing vessel 2 that receives a plurality of objects to be processed, such as semiconductor wafers w, in a tier-like manner to subject the same to a predetermined heating process, and a tubular heater 3 disposed to surround the processing vessel 2 so as to heat the wafers w. The heater 3 and the processing vessel 2 constitute a so-called heat processing furnace.

The processing vessel 2 is also referred to as "process Tube". The processing vessel 2 in this embodiment is made of quartz, and is formed into an elongated tubular shape, such as a cylindrical shape, with an upper end of the processing vessel 2 being closed, while a lower end thereof being opened. Although the processing vessel 2 in this embodiment is of a single tube structure, the processing vessel 2 may be of a double tube structure.

An outward flange 4 is formed on the opening end of the processing vessel 2. The flange 4 is supported by a base plate 5 via a flange holder, not shown. The base plate 5 is provided with an opening 6 through which the processing vessel 2 is inserted upward from below. Connected to a lower part of the processing vessel 2 are an introducing pipe part 7 for introducing a process gas and an inert gas into the processing vessel 2, and an exhaust pipe part, not shown, for discharging a gas in the processing vessel 2. A heat insulating member 8 is disposed inside the opening 6 of the base plate 5 so as to occupy a space between the base plate 5 and the processing vessel 2.

Below the processing vessel 2, there is disposed a lid 9 capable of being vertically moved by an elevating mechanism, not shown, so as to vertically open and close the lower end opening (furnace opening) of the processing vessel 2. A heat retaining tube 10 as heat retaining means of the furnace opening is placed on an upper part of the lid 9. Placed on an upper part of the heat retaining tube 10 is a quartz boat 11 serving as a holder for vertically holding thereon a plurality of (e.g., about 150), for example, 300 mm wafers with predetermined intervals therebetween. On the lid 9, there is disposed a rotating mechanism 12 that rotates the boat 11 about an axial center of the rotating mechanism 12. The boat 11 can be unloaded from the processing vessel 2 to a lower loading area by a downward movement of the lid 9. After the wafers w are transferred, the boat 11 can be loaded into the processing vessel 2 by an upward movement of the lid 9.

The heater 3 is located on the base plate 5. The heater 3 is formed by arranging a heating resistor 14 on an inner circumference of a tubular (e.g., cylindrical) heat insulating member 13. In this embodiment, a wire heating resistor 14 is arranged in a meandering manner on the inner circumference of the heat insulating member 13. The heating resistor 14 is arranged to correspond to each of a plurality of zones that are separated in a height direction of the heater 3, whereby temperatures in the respective zones can be independently controlled. In terms of facilitating arrangement of the heating resistor(s) 14, the heat insulating member 13 is preferably divided in two.

An outer circumference of the heat insulating member 13 is covered with a metallic, e.g., stainless-steel shell 16. The shell 16 is equipped with a cooling-fluid introducing part 26 that is in communication with an inlet orifice 23a of each blowing nozzle 23 (see, FIG. 2A). The heat insulating member 13 in this embodiment is covered with the shell 16 via an outer heat insulating member 15. The shell 16 in this embodiment is formed of an inside shell 16a and an outside shell 16b. By disposing, between the inside shell 16a and the outside shell 16b, a cooling tube (not shown) through which a cooling fluid (cooling water, for example) is circulated, a cooing jacket can be constituted. Thus, a heat influence on an outside of the heater can be effectively restrained.

Meanwhile, an upper heat insulating member 17 is disposed on a top part of the heat insulating member 13 to cover the same (see, FIG. 1). A ceiling plate 18 for covering a top part of the shell 16 is disposed above the upper heat insulating member 17 (see, FIG. 1). The heater 3 is provided with an exhaust heat system 20 for discharging outside an atmosphere in a space 19 between the heater 3 and the processing vessel 2. The exhaust heat system 20 is mainly composed of an exhaust port 21 formed in an upper part of the heater 3, and an exhaust heat pipe (not shown) that connects the exhaust port 21 and a factory exhaust system, not shown, to each other. An exhaust fan and a heat exchanger, which are not shown, may be disposed in the exhaust heat pipe.

The heater 3 is equipped with a cooling unit 22 for blowing a cooling fluid, such as a cooling air, into the space 19 to forcibly cool an inside of the heater 3. The cooling unit 22 has the plurality of blowing nozzles 23 embedded in the heat insulating member 13 of the heater 3 (see, FIG. 1). Each of the blowing nozzles 23 is formed in such a manner that the inlet orifice 23a and an outlet orifice 23b are not linearly aligned to each other. To be specific, in this embodiment, each of the blowing nozzles 23 is formed into a Z-shape in a side view. Namely, each of the blowing nozzles 23 has the inlet orifice 23a and the outlet orifice 23b which are offset in a staggered manner. In this case, it is preferable that, in order to prevent heat from flowing from an outlet orifice side to an inlet orifice side by means of a rising air, a lower end of the blowing nozzle 23 is formed as the inlet orifice 23a, and that an upper end of the blowing nozzle 23 is formed as the outlet orifice 23b.

As shown in FIGS. 3 and 4, the respective blowing nozzles 23 in this embodiment are inclined substantially at 45° relative to a central direction (direction toward the center) of the heater 3 in a plan view, in order to create a helically whirling flow of the cooling fluid in a circumferential direction of the space 19. A rising air is generated in the space 19 in the heater 3, when an air therein is sucked and discharged through the upper exhaust port 21. Thus, it is not necessary that the outlet orifices 23b of the respective blowing nozzles 23 are formed to be directed obliquely upward. Thus, in the drawings, the outlet orifices 23b are directed in a horizontal direction. However, the outlet orifices 23b may be formed to be directed obliquely upward. Each of the blowing nozzles 23 is preferably made of a material having a heat resistivity and a light impermeability, such as ceramics. This is because, if a material of the blowing nozzle 23 has a light permeability, radiant light and/or radiant heat (heat ray) inside the heater may leak outside through each of the blowing nozzles 23.

As shown in FIG. 5A, when the heater 3 in this embodiment is manufactured, a groove 24, in which the blowing nozzle 23 can be embedded, is firstly bored in the heat insulating member 13 from outside. The groove 24 is formed to be inclined substantially at 45° relative to a central direction of the heater 3 in a plan view (see, FIG. 4). Then, as shown in FIG. 5B, the blowing nozzle 23 is inserted into the groove 24, and a gap 25 of the groove 24 is filled with a heat insulating material (for example, an auxiliary heat insulating member described below) in order that the blowing nozzle 23 is not disengaged from the groove 24. In this manner, the blowing nozzle 23 is embedded in the heat insulating member 13 such that an inside and an outside of the heat insulating member 13 are communicated with each other.

Then, after the plurality of blowing nozzles 23 are embedded in the heat insulating member 13 vertically and circumferentially with predetermined intervals therebetween, an outer circumference of the heat insulating member 13 is covered with the shell 16 through the outer heat insulating member 15. Then, as shown in FIG. 2A, the cooling-fluid introducing part 26 is formed in the shell 16 at a region near the inlet orifice 23a of each blowing nozzle 23. Further, a passage (opening) 27, which connects the inlet orifice 23a of the blowing nozzle 23 and the cooling-fluid introducing part 26 to each other, is disposed in the outer heat insulating member 15.

Each of the cooing fluid introducing parts 26 is mainly composed of an opening 28 formed in the inside shell 16a, and a cooling-fluid introducing member (cooling-fluid introducing attachment) 30 attached to an outer surface of the inside shell 16a by a securing member such as a screw 29 so as to cover the opening 28. The cooling-fluid introducing member 30 has a recessed chamber 30a to be in communication with the opening 28. In order to prevent that the cooling-fluid introducing member 30 is heated, an auxiliary heat insulating member 31 is preferably disposed on an inner circumference of the recessed chamber 30a. Connected to the cooling-fluid introducing member 30 is a cooling-fluid supply pipe (not shown) of a cooling-fluid supply unit. The cooling-fluid supply pipe may be equipped with a flowrate adjusting mechanism.

Before the cooling-fluid introducing member 30 is attached, the passage (opening) 27 is formed in the outer heat insulating member 15 to pass therethrough. An auxiliary heat insulating member 32 is disposed on an inner circumference of the passage 27. An opening 33 is formed in the outside shell 16b to assist attachment of the cooling-fluid introducing member 30.

The cooling-fluid supply unit (not shown) may include, for example, a blower (not shown) that sucks, as a cooling fluid, an air in a clean room in which the heat processing apparatus 1 is installed, and that pressure-feeds the cooling fluid to the respective blowing nozzles 23 through the cooling-fluid supply pipe.

The heat processing apparatus 1 as structured above includes: the processing vessel 2 that receives a plurality of wafers w in a tier-like manner to subject the wafers w to a predetermined heating process; the tubular heater 3 disposed to surround the processing vessel 2 and capable of heating the wafers w; the exhaust heat system 20 for discharging an atmosphere in the space 19 between the heater 3 and the processing vessel 2; and the cooling unit 22 that blows out the cooling fluid into the space 19 to cool the processing vessel 2. The heater 3 is provided with the tubular heat insulating member 13, and the heating resistor 14 arranged on an inner circumference of the heat insulating member 13. The cooling unit 22 is provided with the plurality of blowing nozzles 23 embedded in the heat insulating member 13. Each of the blowing nozzles 23 is formed in such a manner that the inlet orifice 23a and the outlet orifice 23b are not linearly aligned to each other. Therefore, it is possible to prevent leakage of radiant light from the blowing nozzles 23, and to restrain degradation of uniformity of temperature inside the heater and elevation of temperature (of an atmosphere) outside the heater.

In addition, in this embodiment, each of the blowing nozzles 23 is formed into substantially a Z-shape in a side view, and a lower end of the blowing nozzle 23 forms the inlet orifice 23a while an upper end thereof forms the outlet orifice 23b. Thus, with such a simple structure, leakage and/or escape of radiant light and/or radiant heat from each of the blowing nozzles 23 can be prevented.

In addition, in this embodiment, the respective blowing nozzles 23 are inclined substantially at 45° relative to a central direction of the heater 3 in a plan view, in order to create a whirling flow of the cooling fluid in a circumferential direction of the space 19. Thus, non-uniformity of cooling temperature can be effectively restrained, and uniformity in product quality of the wafers w can be improved.

In addition, in this embodiment, an outer circumference of the heat insulating member 13 is covered with the shell 16 through the outer heat insulating member 15. The cooling-fluid introducing part 26 is formed in the shell 16 at a region near the inlet orifice 23a of each blowing nozzle 23. The passage 27, which connects the inlet orifice 23a of the blowing nozzle 23 and the cooling-fluid introducing part 26 to each other, is disposed in the outer heat insulating member 15.

Thus, with such a simple structure, a cooling fluid can be supplied to each of the blowing nozzles 23.

Moreover, the manufacturing method of the heater 3 in this embodiment includes the steps of: arranging the heating resistor 14 on an inner circumference of the heat insulating member 13; and embedding the plurality of blowing nozzles 23, each having a substantially Z-shape in a side view, in the heat insulating member 13 in such a manner that the respective blowing nozzles 23 are inclined substantially at 45° relative to a central direction of the heater 3 (i.e., heat insulating member 13) in a plan view, in order to create a flow of the cooling fluid which whirls along the inner circumference of the heat insulating member 13. Thus, it is possible to prevent leakage of radiant light from the blowing nozzles 23, and to restrain degradation of uniformity of temperature inside the heater and elevation of temperature outside the heater. As a result, non-uniformity of cooling temperature can be effectively restrained, while a structure can be simplified.

FIG. 6 is a sectional view of a partial modification of the blowing nozzle shown in FIG. 4. In FIG. 6, the same members are shown by the same reference numbers as those in FIG. 4. In the example shown in FIG. 6, an outlet orifice part of the blowing nozzle 23 is cut so as to be flush with an inner circumferential surface of the heat insulating member 13.

Figure 7:
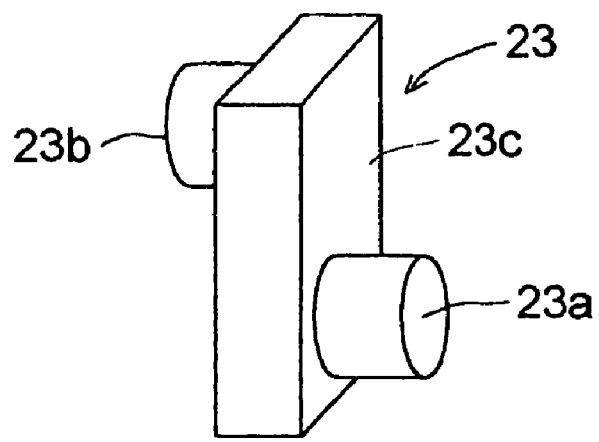
FIG. 7 is a perspective view of another modification of the blowing nozzle.

FIG. 7 is a perspective view of another modification of the blowing nozzle. In the example shown in FIG. 7, the blowing nozzle 23 is composed of an elongated hollow box part 23c, an outlet orifice part 23b, and an inlet orifice part 23a. The outlet part 23b and the inlet orifice part 23a, which are respectively disposed in a front surface and a rear surface of the hollow box part 23c, are staggered to each other.

Figure 8:
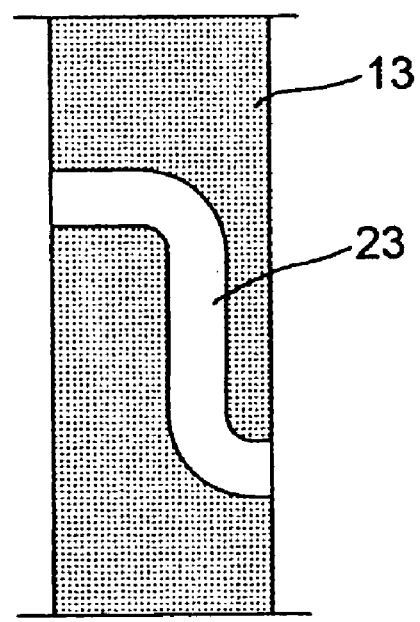
FIG. 8 is a sectional view of a modification of the blowing nozzle disposed in a heat insulating member.

The embodiment of the present invention has been described in detail with reference to the drawings. However, the present invention is not limited to the above embodiment, and can be variously modified within the scope of the present invention. For example, as shown in FIG. 8, the blowing nozzle 23 may be formed integrally with the heat insulating member to define a passage of a Z-cross-section in the heat insulating member.

The invention claimed is:

1. A heat processing apparatus comprising:
a processing vessel that receives a plurality of objects to be processed in a tier-like manner to subject the objects to be processed to a predetermined heating process;
a tubular heater disposed to surround the processing vessel, the tubular heater being capable of heating the objects to be processed;
an exhaust heat system for discharging an atmosphere in a space between the heater and the processing vessel; and
a cooling unit that blows out a cooling fluid into the space to cool the processing vessel;
wherein the heater has a tubular heat insulating member, and a heating resistor arranged on an inner circumference of the heat insulating member,
the cooling unit has a plurality of blowing nozzles embedded in the heat insulating member;
each of the blowing nozzles is formed into a substantially Z-shape in a side view, with a lower end of the blowing nozzle forming the inlet orifice while an upper end thereof forming the outlet orifice, and
the respective blowing nozzles are inclined substantially at 45° relative to a direction toward a central axis of the heater in a plan view, in order to create a whirling flow of the cooling fluid in a circumferential direction of the space.

2. The heat processing apparatus according to claim 1, wherein
an outer circumference of the heat insulating member is covered with a shell, and
the shell has a cooling-fluid introducing part that is in communication with the inlet orifice of each of the blowing nozzles.

3. A heater comprising:
a tubular heat insulating member; and
a heating resistor arranged on an inner circumference of the insulating member;
wherein a plurality of cooling-fluid blowing nozzles, each having a substantially Z-shape in a side view, are embedded in the heat insulating member in such a manner that the cooling-fluid blowing nozzles are inclined substantially at 45° relative to a direction toward a central axis of the heater in a plan view, in order to create a flow of a cooling fluid which whirls along the inner circumference of the heat insulating member.

4. A method of manufacturing a heater including a tubular heat insulating member and a heating resistor arranged on an inner circumference of the insulating member, the method comprising the steps of:
arranging the heating resistor on the inner circumference of the heat insulating member; and
embedding a plurality of cooling-fluid blowing nozzles, each having a substantially Z-shape in a side view, in the heat insulating member in such a manner that the cooling-fluid blowing nozzles are inclined substantially at 45° relative to a direction toward a central axis of the heater in a plan view, in order to create a flow of a cooling fluid which whirls along the inner circumference of the heat insulating member.

* * * * *